United States Patent
Campbell et al.

(10) Patent No.: US 6,217,412 B1
(45) Date of Patent: Apr. 17, 2001

(54) METHOD FOR CHARACTERIZING POLISH PAD LOTS TO ELIMINATE OR REDUCE TOOL REQUALIFICATION AFTER CHANGING A POLISHING PAD

(75) Inventors: William Jarrett Campbell; Jeremy Lansford, both of Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/372,017

(22) Filed: Aug. 11, 1999

(51) Int. Cl.[7] ................................................. B24B 49/00
(52) U.S. Cl. ................................. 451/8; 451/10; 451/22; 451/203
(58) Field of Search ........................................ 451/8, 10, 22, 451/283, 287, 5

(56) References Cited

U.S. PATENT DOCUMENTS

| | | | |
|---|---|---|---|
| 5,851,135 | * | 12/1998 | Sandhu et al. . |
| 5,921,853 | * | 7/1999 | Nishio . |
| 5,934,974 | * | 8/1999 | Tzeng . |
| 6,004,187 | * | 12/1999 | Nyui et al. . |

* cited by examiner

Primary Examiner—Timothy V. Eley
Assistant Examiner—Willie Berry, Jr.
(74) Attorney, Agent, or Firm—Williams, Morgan & Amerson

(57) ABSTRACT

The present invention is directed to semiconductor processing operations, and, more particularly, chemical mechanical polishing operations. The present invention is comprised of a method for qualifying new polishing pads used in a polishing tool without the necessity of polishing test wafers.

23 Claims, 2 Drawing Sheets

METHOD FOR CHARACTERIZING POLISH PAD LOTS TO ELIMINATE OR REDUCE TOOL REQUALIFICATION AFTER CHANGING A POLISHING PAD

BACKGROUND OF THE INVENTION

1. Field of the Invention

The present invention is generally related to the field of semiconductor processing, and, more particularly, to a method for characterizing polish pad lots to eliminate or reduce tool requalification after changing a polishing pad.

2. Description of the Related Art

Chemical mechanical polishing ("CMP") is widely used in semiconductor processing operations as a means of planarizing various process layers, e.g., silicon dioxide, formed above a wafer comprised of a semiconducting material, such as silicon. Chemical mechanical polishing operations typically employ an abrasive slurry distributed in an alkaline or acidic solution to planarize the surface of a process layer through a combination of mechanical and chemical actions.

The continual drive to reduce feature sizes, e.g., channel length, on semiconductor devices has increased the importance of chemical mechanical polishing or planarization in the semiconductor fabrication process. For example, as feature sizes tend to decrease, the depth of field of photolithography equipment tends to shrink, thereby necessitating a very flat surface so that very small dimensions may be accurately patterned on a wafer. Additionally, there has been, and continues to be, a constant drive to increase the productivity of fabrication techniques employed in making modern semiconductor devices. In short, there is a constant drive within the industry to make the same high-quality semiconductor products, but to do it faster, better, and in a less expensive manner.

FIG. 1 is a schematic drawing of one illustrative embodiment of a chemical mechanical polishing tool used in semiconductor processing operations. As depicted therein, the illustrative polishing tool 10 is comprised of a rotatable table 12 on which an illustrative polishing pad 14 is mounted, and a multi-head carrier 16 positioned above the pad 14. The multi-head carrier 16 includes a plurality of rotatable polishing arms 18, each of which includes a carrier head 20. Typically, wafers (not shown) are secured to the carrier heads 20 by the use of vacuum pressure. This is sometimes referred to as the carrier backforce pressure. In use, the table 12 is rotated and an abrasive slurry is dispersed onto the polishing pad 14. Once the slurry has been applied to the polishing pad 14, a downforce is applied to each rotating polishing arm 18 to press its respective wafer against the polishing pad 14. As the wafer is pressed against the polishing pad 14, the surface of the wafer is mechanically and chemically polished. Although the device depicted in FIG. 1 is a multi-head polishing device, similar single-head type machines exist in the industry, and the present invention is not limited to any particular embodiment, form or structure of a tool that may be used to perform chemical mechanical polishing operations.

In general, wafers are polished according to various polishing recipes that may vary, depending upon a variety of factors, e.g., the type of material being polished, the desired rate of removal of the product, etc. During the course of polishing the wafers, the polishing pad 14, which is typically comprised of polyurethane, absorbs or retains various by-products from the polishing operation, such as residual material from the process layer and/or the polishing slurry. The accumulation of such material is known as glazing. Glazing of the polishing pad 14 can affect numerous polishing parameters, e.g., the rate at which material is removed. etc. In general, the polishing pad 14 becomes glazed, the rate of removal of a process layer during polishing operations tends to decrease. This reduction in removal rate may be compensated for by, for example, increasing the duration of the polishing operation, etc.

At some point, a decision is made that the polishing pad 14 is no longer fit for service. At that time, a new polishing pad is placed on the polishing tool 10. Thereafter, the polishing pad 14 is characterized through the use of multiple test wafers. In this characterization process, the test wafers are polished with the new pad and parameters such as the uniformity of the removal across the surface of the wafer, the rate of removal, etc., are determined. Because this process of recharacterizing or requalifying the polishing pad 14 is performed on test wafers, it does not add any value to any finished product, and it can be very time-consuming and expensive.

The present invention is directed to a method of solving, or at least reducing, some or all of the aforementioned problems.

SUMMARY OF THE INVENTION

The present invention is directed to semiconductor processing operations and, in particular, a method for enhancing chemical mechanical polishing operations performed in the manufacture of various semiconductor devices. The method comprises polishing a production wafer using a first polishing pad and an initial set of polishing parameters, replacing the first polishing pad with a second polishing pad, and polishing production wafers using the second polishing pad and at least some of the initial set of polishing parameters used with the first polishing pad. The method continues with determining if the polishing parameters used with the second pad are acceptable based upon data obtained from the production wafers polished with the second polishing pad.

BRIEF DESCRIPTION OF THE DRAWINGS

The invention may be understood by reference to the following description taken in conjunction with the accompanying drawings, in which like reference numerals identify like elements, and in which.

Figure 1:
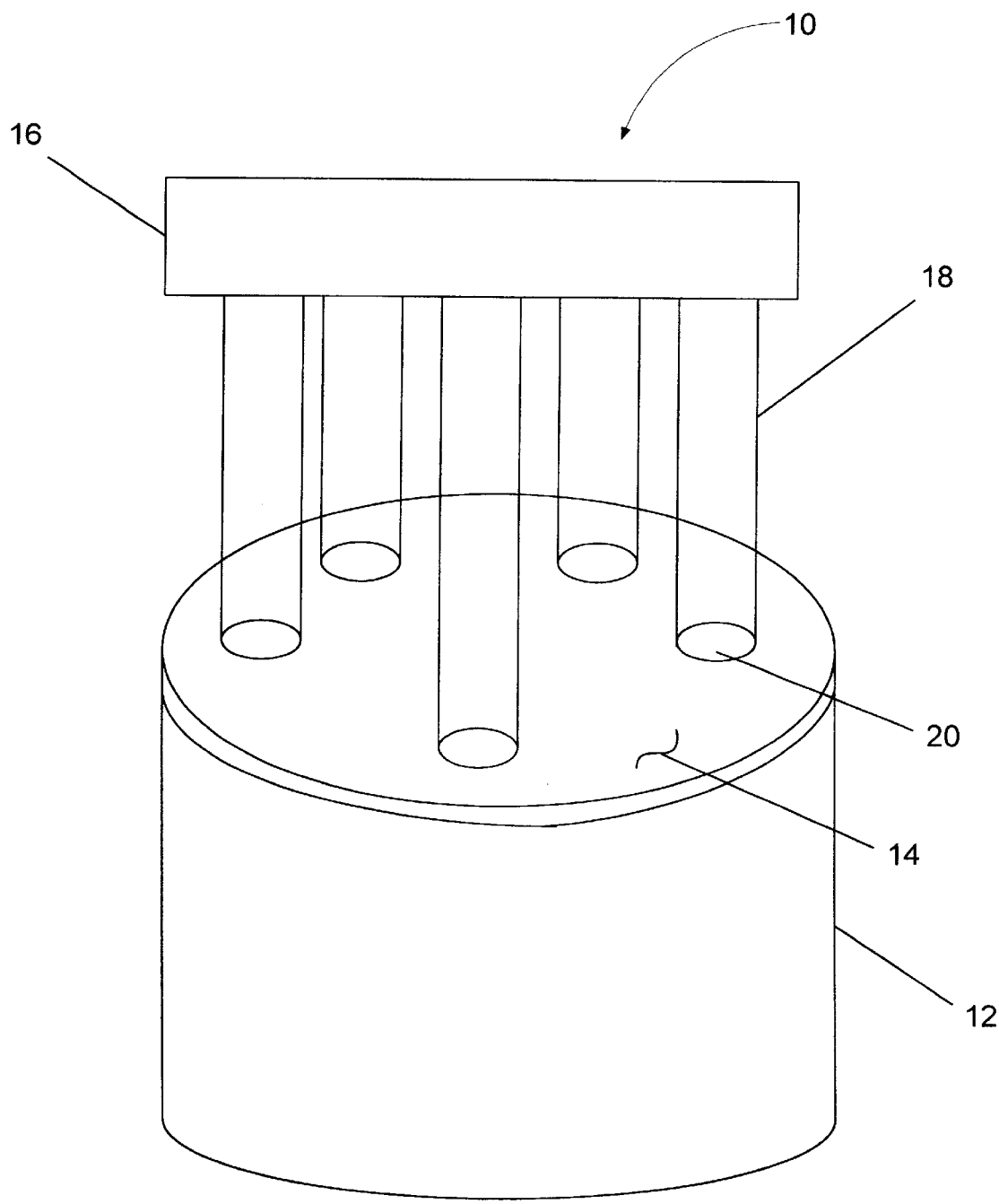
FIG. 1 is a schematic drawing of an illustrative polishing tool.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention is directed to a process control method related to polishing or planarizing, a surface of process layers formed above a semiconducting substrate. In disclosing the present invention, reference will be made to FIGS. 1–2. However, the relative sizes of the various features depicted in the drawings may be exaggerated or reduced as compared to the size of those feature sizes on actual devices. Nevertheless, the attached drawings are included to aid in obtaining an understanding of the present invention. Moreover, the present method is applicable to a variety of technologies, e.g., NMOS, PMOS, CMOS, etc., and is readily applicable to a variety of devices, including, but not limited to, logic devices, memory devices, etc.

As stated previously, polishing operations performed in traditional semiconductor manufacturing, operations necessitate that, after a period of time, the polishing pad 14 used in such operations needs to be changed. The exact frequency at which this occurs may vary depending upon the particular application. For example, depending upon the type of process layer polished, the polishing pad 14 may have to be replaced after, for example, 2000 wafers have been polished with the pad 14.

The present invention is generally related to reducing or eliminating the need for characterizing or qualifying a new polishing pad 14 to be used on the polishing tool 10. Historically, this process of characterizing new polishing pads has involved the polishing of one or more test wafers, and obtaining data, such as rate of removal, uniformity of removal across the surface of the wafer. etc., for such test wafers. This data is typically obtained by a variety of metrology tools such as an Optiprobe and/or Prometrix. Of course, other metrology tools may be used to obtain such illustrative data.

Figure 2:
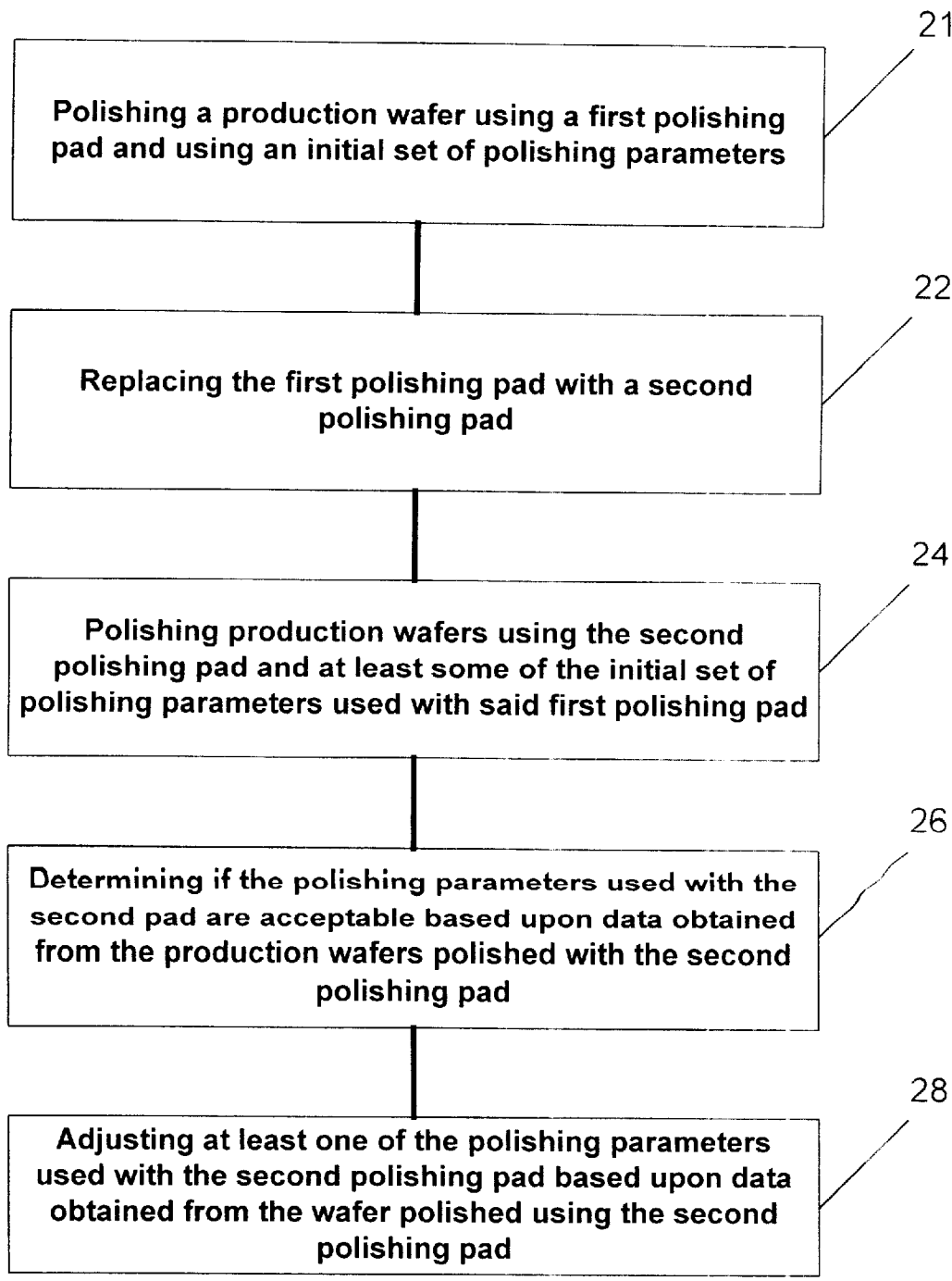
FIG. 2 is a flowchart depicting one illustrative embodiment of the present invention.

One illustrative embodiment of the present invention is depicted in FIG. 2. As shown therein, the illustrative embodiment comprises the action of polishing a production wafer using a first polishing pad and using an initial set of polishing parameters, as indicated at block 21. As a practical matter, the use of the present invention will typically involve use of the previously mentioned test wafers to qualify the very first polishing pad in accordance with known techniques. For example, the very first polishing pad used on the polishing tool may need to be qualified using the test wafers described above. Thereafter, using the present invention, polishing pads may be changed out without the need for using the qualifying wafers.

The initial set of polishing parameters, indicated in block 21, may be any of the variety of parameters of a polishing operation that may affect the polishing operation performed on the wafer. For example, these parameters could include, but are not limited to, the rotational speed of the polishing pad 14, the upforce applied by the polishing pad 14 (for certain types of polishing tools), the duration of the polishing operation, the amount of down-force by each polishing arm 18, the amount of carrier backforce pressure used to secure the wafer to each polishing arm 18, the rotational speed of each polishing arm 18, and/or the oscillation of each polishing arm 18, may be varied to control the polishing operations performed on a particular wafer.

Next, as indicated at block 22, the first polishing pad 14 is replaced with a second polishing pad. This step is performed at the point when the first polishing pad 14 fails to provide satisfactory polishing results. Of course, the timing of when this step is performed may be varied, depending upon the particular application involved. Additionally, the second polishing pad is typically from the same lot of polishing pads supplied by the pad manufacturer, although that may not be required in all cases.

Next, as indicated at block 24, production wafers are polished using the second polishing pad and at least some of the initial set of polishing parameters used with the first polishing pad 14. That is, the initial polishing operation performed with the second polishing pad is set based upon the polishing operations, typically the initial operations, performed by the first polishing pad 14. In this step, it should be noted that not all of the polishing parameters need be identical for the first and second pads. For example, while the rotational speed of the first and second polishing pads may be approximately the same, there may be variations in other process parameters depending upon the particular application, e.g. the arm downforce may vary depending upon the type and thickness of the layer to be polished. In a similar fashion, the time duration of the polishing operation may be set to be approximately the same as the time duration of the polishing operation used with the first polishing pad 14.

Thereafter, as indicated in block 26, the present invention involves determining if the polishing parameters used with the second pad are acceptable based upon data obtained from the production wafers polished with the second polishing pad. In effect, this step qualifies the second polishing pad based upon production wafers, not test wafers. In this manner, the present invention allows for cost and time savings in semiconductor processing operations. To determine if the polishing parameters used with the second pad are acceptable, a variety of metrology tools may be used. For example, an Optiprobe, or other similar type tool, may be used to determine the uniformity of the rate of removal across the surface of the wafer, and the rate of removal in the process layer may be determined by taking the appropriate before and after thickness measurements and determining the difference between those measurements, and dividing by the polishing time.

As indicated in block 28, if necessary, one or more of the polishing parameters used with the second polishing pad may be adjusted based upon the data obtained from the production wafers polished using the second polishing pad. The parameters controlled may be varied as a matter of design choice. For example, if it is determined that the rate of removal with the second polishing pad is less than acceptable, the rotational speed of the second polishing pad may be increased.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   polishing a first sit of production wafers using a fist polishing pad and an initial set of polishing parameters;
   replacing the first polishing pad with a second polishing pad;
   polishing a second set of production wafers using the second polishing pad and at least some of the initial set of polishing parameters used with said first polishing pad;
   obtaining data including a rate of removal of a of a process layer from said second set of production wafers based upon said polishing said second set of production wafers using the second polishing pad; and
   determining if said rate of removal of said process layer from said second set of production wafers using the second polishing pad is acceptable based upon said data obtained from the second set of production wafers polished using the second polishing pad.

2. The method of claim 1, wherein said initial set of polishing parameters comprises at least one of:
   a rotational speed of said first polishing pad;
   a time duration for polishing said first set of production wafers with said first polishing pad;
   a downforce applied by a polishing arm;
   a rotational speed of said polishing arm;
   an oscillation path of said polishing arm; and
   an upforce applied by said polishing pad.

3. The method of claim 1, wherein polishing a second set of production wafers using the second polishing pad and at least some of the initial set of polishing parameters used with said first polishing pad comprises polishing a second set of production wafers using the second polishing pad set at a rotational speed that is approximately the same as a rotational speed of said first polishing pad.

4. The method of claim 1, wherein polishing a second set of production wafers using the second polishing pad and at least some of the initial set of polishing parameters used with said first polishing pad comprises polishing a second set of production wafers using the second polishing pad for a time duration that is approximately the same as a time duration used with said first polishing pad.

5. The method of claim 1, farther comprising: determining if a surface uniformity of said process layer from said second set of production wafers using the second polishing pad is acceptable based upon said data obtained from the second set of production wafers polished with the second polishing pad.

6. The method of claim 1, wherein said first set of production wafers and said second set of production wafers are different.

7. A method, comprising:
   polishing a first set of production wafers using a first polishing pad and an initial set of polishing parameters;
   replacing the first polishing pad with a second polishing pad;
   polishing a second set of production wafers using the second polishing pad and at least some of the initial set of polishing parameters used with said first polishing pad;
   obtaining data including a rate of removal of a process layer from said second set of production wafers based upon said polishing said second set of production wafers using the second polishing pad,
   determining if said rate of removal of said process layer from said second set of production wafers polished using the second polishing pad is acceptable based upon said data obtained from the second set of production wafers polished using the second polishing pad; and
   adjusting at least one of the polishing parameters used with the second polishing pad based upon said data obtained from the second set of production wafers polished using the second polishing pad.

8. The method of claim 7, wherein said initial set of polishing parameters comprises at least one of:
   a rotational speed of said first polishing pad;
   a time duration for polishing said first set of production wafers with said first polishing pad;
   a downforce applied by a polishing arm;
   a rotational speed of said polishing arm;
   an oscillation pad of said polishing arm; and
   an upforce applied by sad polishing pad.

9. The method of claim 7, wherein polishing a second set of production wafers using the second polishing pad and at least some of die initial set of polishing parameters used with said first polishing pad comprises polishing a second set of production wafers using the second polishing pad set at a rotational speed that is approximately the same as a rotational speed of said first polishing pad.

10. The method of claim 7, wherein polishing a second set of production wafers using the second polishing pad and at least some of the initial set of polishing parameters used with said first polishing pad comprises polishing a second set of production wafers using the second polishing pad for a time duration that is approximately the same as a time duration used with said first polishing pad.

11. The method of claim 7, further comprising:
    determining if a surface uniformity of said process layer from said second set of production wafers using the second polishing pad is acceptable based upon said data obtained from the second set of production wafers polished using the second polishing pad.

12. The method of claim 7, wherein said at least one polishing parameters is comprised of one of:
    a rotational speed of said second polishing pad, a time duration of a polishing operation with said second polishing pad, a rotational speed of a polishing arm, a downforce applied by a polishing arm, an oscillation path of a polishing arm, and an upforce applied by said polishing pad.

13. The method of claim 7, wherein said first set of production wafers and said second set of production wafers are different.

14. A method, comprising:
    polishing a first set of production wafers using a first polishing pad and an initial set of polishing parameters;
    replacing the first polishing pad with a second polishing pad;
    polishing a second set of production wafers using the second polishing pad and at least some of the initial set of polishing parameters used with said first polishing pad;
    obtaining data including a surface uniformity of a process layer based upon said polishing of said second set of production wafers using the second polishing pad; and
    determining if said surface uniformity of said process layer polished using the second polishing pad is acceptable based upon said data obtained from the second set of production wafers polished using the second polishing pad.

15. The method of claim 14, wherein said initial set of polishing parameters comprises at least one of:
- a rotational speed of said first polishing pad;
- a time duration for polishing said first set of production wafers with said first polishing pad;
- a downforce applied by a polishing arm;
- a rotational speed of said polishing arm;
- an oscillation path of said polishing arm; and
- an upforce applied by said polishing pad.

16. The method of claim 14, wherein polishing a second set of production wafers using the second polishing pad and at least some of the initial set of polishing parameters used with said first polishing pad comprises polishing a second set of production wafers using the second polishing pad set at a rotational speed that is approximately the same as a rotational speed of said first polishing pad.

17. The method of claim 14, wherein polishing a second set of production wafers using the second polishing pad and at least some of the initial set of polishing parameters used with said first polishing pad comprises polishing a second set of production wafers using the second polishing pad for a time duration that is approximately the same as a time duration used with said first polishing pad.

18. The method of claim 14, wherein said first set of production wafers and said second set of production wafers are different.

19. A method, comprising:
- polishing a first set of production wafers using a first polishing pad and an initial set of polishing parameters;
- replacing the first polishing pad with a second polishing pad;
- polishing a second set of production wafers using the second polishing pad and at least some of the initial set of polishing parameters used with said first polishing pad;
- obtaining data including a surface uniformity of a process layer based upon said polishing production wafers using the second polishing pad;
- determining if said surface uniformity of said process layer polished using the second polishing pad is acceptable based upon said data obtained from the second set of production wafers polished using the second polishing pad; and
- adjusting at least one of the polishing parameters used with the second polishing pad based upon said data obtained from the second set of production wafers polished using the second polishing pad.

20. The method of claim 19, wherein said initial set of polishing parameters comprises at least one of:
- a rotational speed of said first polishing pad;
- a time duration for polishing said first set of production wafers with said first polishing pad;
- a downforce applied by a polishing arm;
- a rotational speed of said polishing arm;
- an oscillation path of said polishing arm; and
- an upforce applied by said polishing pad.

21. The method of claim 19, wherein polishing a second set of production wafers using the second polishing pad and at least some of the initial set of polishing parameters used with said first polishing pad comprises polishing a second set of production wafers using the second polishing pad set at a rotational speed that is approximately the same as a rotational speed of said first polishing pad.

22. The method of claim. 19, wherein polishing a second set of production wafers using the second polishing pad and at least some of the initial set of polishing parameters used with said first polishing pad comprises polishing a second set of production wafers using the second polishing pad for a time duration that is approximately the same as a time duration used with said first polishing pad.

23. The method of claim 19, wherein said first set of production wafers and said second set of production wafers are different.

* * * * *